United States Patent
Kobayashi et al.

(10) Patent No.: US 11,881,794 B2
(45) Date of Patent: Jan. 23, 2024

(54) ELECTROSTATIC ADSORPTION MEMBER AND SUBSTRATE FIXING DEVICE

(71) Applicant: SHINKO ELECTRIC INDUSTRIES CO., LTD., Nagano (JP)

(72) Inventors: Hiroyuki Kobayashi, Nagano (JP); Naoyuki Koizumi, Nagano (JP); Akihiko Tateiwa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/727,039

(22) Filed: Apr. 22, 2022

(65) Prior Publication Data

US 2022/0345054 A1 Oct. 27, 2022

(30) Foreign Application Priority Data

Apr. 23, 2021 (JP) .................................. 2021-073287

(51) Int. Cl.
*H02N 13/00* (2006.01)
*H01J 37/32* (2006.01)

(52) U.S. Cl.
CPC ....... *H02N 13/00* (2013.01); *H01J 37/32715* (2013.01); *H01J 2237/2007* (2013.01); *H01J 2237/334* (2013.01)

(58) Field of Classification Search
CPC ............... H02N 13/00; H01L 21/6833; H01L 21/67017; H01L 21/383; H01L 21/67109; H01J 37/32715; H01J 2237/2007
USPC ......................................................... 361/234
See application file for complete search history.

(56) References Cited

U.S. PATENT DOCUMENTS

| | | | | |
|---|---|---|---|---|
| 6,108,189 A | * | 8/2000 | Weldon | ............... C23C 16/4586 279/128 |
| 6,481,886 B1 | * | 11/2002 | Narendrnath | ..... H01L 21/67248 374/161 |
| 2016/0276198 A1 | | 9/2016 | Anada et al. | |
| 2017/0358476 A1 | | 12/2017 | Horiuchi et al. | |
| 2020/0411355 A1 | * | 12/2020 | Noorbakhsh | ....... H01L 21/6833 |

FOREIGN PATENT DOCUMENTS

| | | |
|---|---|---|
| JP | 2013-232641 | 11/2013 |
| JP | 2014-2097615 | 11/2014 |
| JP | 2017-218352 | 12/2017 |

* cited by examiner

*Primary Examiner* — Danny Nguyen
(74) *Attorney, Agent, or Firm* — Rankin, Hill & Clark LLP (57) ABSTRACT

An electrostatic adsorption member includes a dielectric member having a first surface and a second surface opposite to the first surface and formed with a through-hole penetrating from the first surface to the second surface, and a porous body provided in the through-hole and having a third surface flush with the first surface. The through-hole has a first opening apart from the first surface by a first distance in a first direction perpendicular to the first surface, and a second opening apart from the first surface by a second distance larger than the first distance in the first direction. In a plan view from the first direction, at least a portion of the first opening is inside the second opening, and the porous body has a first portion located inside the first opening, and a second portion connected to the first portion and located outside the first opening.

11 Claims, 5 Drawing Sheets

ELECTROSTATIC ADSORPTION MEMBER AND SUBSTRATE FIXING DEVICE

CROSS-REFERENCE TO RELATED APPLICATIONS

This application is based on and claims the benefit of priority from prior Japanese patent application No. 2021-073287 filed on Apr. 23, 2021, the entire contents of which are incorporated herein by reference.

TECHNICAL FIELD

The present disclosure relates to an electrostatic adsorption member and a substrate fixing device.

BACKGROUND ART

As a substrate fixing device used for fixing a substrate such as a wafer, known is a substrate fixing device where an electrostatic adsorption member is formed with a through-hole for a cooling gas for cooling a substrate and a porous body for suppressing abnormal electrical discharge is provided in the through-hole.

CITATION LIST

Patent Literature

PTL 1: JP-A-2014-209615
PTL 2: JP-A-2013-232641
PTL 3: JP-A-2017-218352

SUMMARY OF INVENTION

Abnormal electrical discharge may occur even in the substrate fixing device of the related art provided with the porous body.

Aspect of non-limiting embodiments of the present disclosure is to provide an electrostatic adsorption member and a substrate fixing device capable of further suppressing abnormal electrical discharge.

According to an aspect of the present disclosure, there is provided an electrostatic adsorption member comprising:
  a dielectric member having a first surface and a second surface on an opposite side to the first surface and formed with a through-hole penetrating from the first surface to the second surface; and
  a porous body provided in the through-hole and having a third surface flush with the first surface,
  wherein the through-hole has:
  a first opening apart from the first surface by a first distance in a first direction perpendicular to the first surface, and
  a second opening apart from the first surface by a second distance larger than the first distance in the first direction,
  wherein in a plan view from the first direction, at least a portion of the first opening is inside the second opening, and
  wherein in a plan view from the first direction, the porous body has:
  a first portion located inside the first opening, and
  a second portion connected to the first portion and located outside the first opening.

According to the present disclosure, it is possible to further suppress abnormal electrical discharge.

DESCRIPTION OF EMBODIMENTS

The present inventors have made diligent studies so as to investigate a cause of abnormal electrical discharge occurring even in a substrate fixing device of the related art provided with a porous body. As a result, it was found that the porous body may be detached from the through-hole when the substrate is not placed on the electrostatic adsorption member, such as during maintenance of the substrate fixing device. For example, in a case where the porous body is bonded to an inner wall surface of the through-hole by an adhesive, the adhesive may be deteriorated by repeated irradiation of plasma for treatment of the substrate. When a cooling gas is supplied to the through-hole from a gas channel provided in a base plate in a state where the adhesive is deteriorated, the porous body may be detached from the through-hole due to a gas pressure. Even when the porous body is embedded in the through-hole by using an inorganic paste, the adhesion is reduced due to deterioration over time, and when the cooling gas is supplied to the through-hole from the gas channel provided in the base plate, the porous body may be detached from the through-hole due to a gas pressure. The porous body is detached, so that abnormal electrical discharge is likely to occur during a subsequent treatment of the substrate.

The present disclosure has been made based on such findings, and suppresses the detachment of the porous body from the through-hole, thereby further suppressing the abnormal electrical discharge.

Hereinafter, embodiments of the present disclosure will be described with reference to the accompanying drawings. Note that, in the specification and drawings, the constitutional elements having substantially the same functional configurations are denoted with the same reference signs, and the overlapping descriptions may be omitted.

First Embodiment

Figure 1:
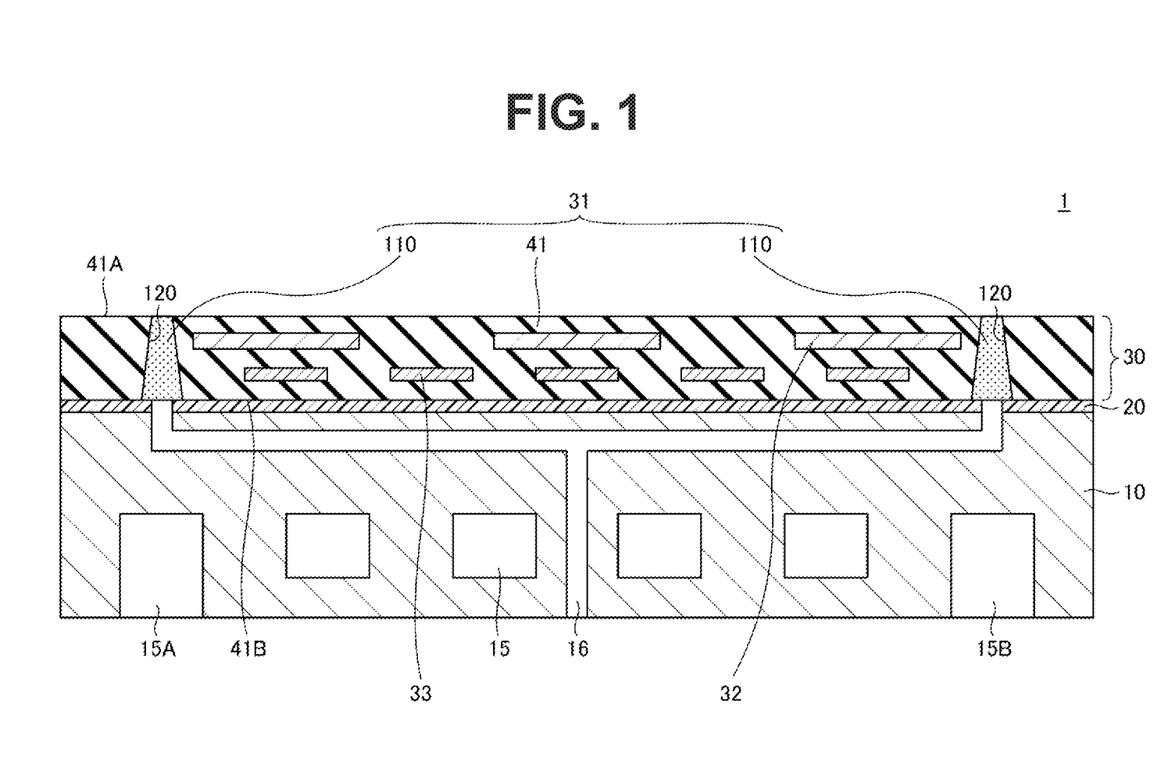
FIG. 1 is a cross-sectional view showing a substrate fixing device according to a first embodiment.

First, a first embodiment is described. FIG. 1 is a cross-sectional view showing a substrate fixing device according to a first embodiment.

As shown in FIG. 1, a substrate fixing device 1 according to the first embodiment includes, main constitutional elements, a base plate 10, an adhesive layer 20, and an electrostatic adsorption member 30.

The base plate 10 is a member for mounting the electrostatic adsorption member 30. A thickness of the base plate 10 may be, for example, about 20 mm to 50 mm. The base plate 10 is formed of, for example, aluminum, and can also be used as an electrode or the like for controlling plasma. By supplying predetermined high-frequency electric power to the base plate 10, the energy for causing ions and the like in a generated plasma state to collide with a substrate such as a wafer adsorbed on the electrostatic adsorption member 30 can be controlled and etching processing can be effectively performed.

The base plate 10 is provided therein with a water channel 15. The water channel 15 has a cooling water introduction portion 15A at one end and a cooling water discharge portion 15B at the other end. The water channel 15 is connected to a cooling water control device (not shown) provided outside the substrate fixing device 1. The cooling water control device (not shown) is configured to introduce cooling water from the cooling water introduction portion 15A into the water channel 15 and to discharge the cooling water from the cooling water discharge portion 15B. By circulating the cooling water in the water channel 15 to cool the base plate 10, it is possible to cool the substrate adsorbed on the electrostatic adsorption member 30.

The base plate 10 is further provided therein with a gas channel 16. An inert gas such as a helium (He) gas for cooling the substrate adsorbed on the electrostatic adsorption member 30 is introduced into the gas channel 16.

The electrostatic adsorption member 30 has a base body 31, an electrostatic electrode 32, and a heat generating body 33. The electrostatic adsorption member 30 is, for example, a Johnsen-Rahbek type electrostatic chuck. The electrostatic adsorption member 30 may also be a Coulomb force type electrostatic chuck.

The base body 31 has a dielectric member 41 and a plurality of porous bodies 110.

A material of the dielectric member 41 is, for example, ceramics such as aluminum oxide ($Al_2O_3$) and aluminum nitride (AlN). A thickness of the dielectric member 41 is, for example, about 1 mm to 10 mm, and a relative permittivity of the dielectric member 41 is, for example, about 9 to 10 at a frequency of 1 kHz.

The dielectric member 41 has a first surface 41A and a second surface 41B on an opposite side to the first surface 41A. The second surface 41B is bonded to the base plate 10 by the adhesive layer 20. The substrate is adsorbed on the first surface 41A. The dielectric member 41 is formed with a plurality of through-holes 120 penetrating from the first surface 41A to the second surface 41B. The through-holes 120 are configured to communicate with the gas channel 16 of the base plate 10. One porous body 110 is provided in each through-hole 120. Shapes of the porous body 110 and the through-hole 120 will be described later.

The electrostatic electrode 32 is, for example, a thin film electrode, and is embedded in the dielectric member 41. The electrostatic electrode 32 is connected to a power supply provided outside the substrate fixing device 1, and when a predetermined voltage is applied thereto, an adsorption force due to static electricity is generated between the electrostatic electrode and the substrate, so that the substrate can be adsorbed and held on the electrostatic adsorption member 30. The higher the voltage applied to the electrostatic electrode 32 is, the stronger the adsorption holding force is. The electrostatic electrode 32 may have a unipolar shape or a bipolar shape. As the electrostatic electrode 32, a sintered body of tungsten, molybdenum or the like may be used, for example.

The heat generating body 33 is embedded in the dielectric member 41. As the heat generating body 33, a sintered body of tungsten, molybdenum or the like may be used, for example. As the heat generating body 33, a rolled alloy may also be used.

The adhesive layer 20 bonds the electrostatic adsorption member 30 to the base plate 10. As the adhesive layer 20, a silicone-based adhesive may be used, for example. The adhesive layer 20 may also contain a filler such as alumina or aluminum nitride. A thickness of the adhesive layer 20 is, for example, about 0.1 mm to 3 mm. A thermal conductivity of the adhesive layer 20 is preferably 2 W/m·K or higher. The adhesive layer 20 may also be formed by a single layer or a plurality of layers. For example, by forming a two-layer structure where an adhesive having a high thermal conductivity and an adhesive having a low elastic modulus are combined, an effect of reducing stress generated by a difference in thermal expansion between the base plate 10 and the electrostatic adsorption member 30 can be obtained.

Figure 2A:
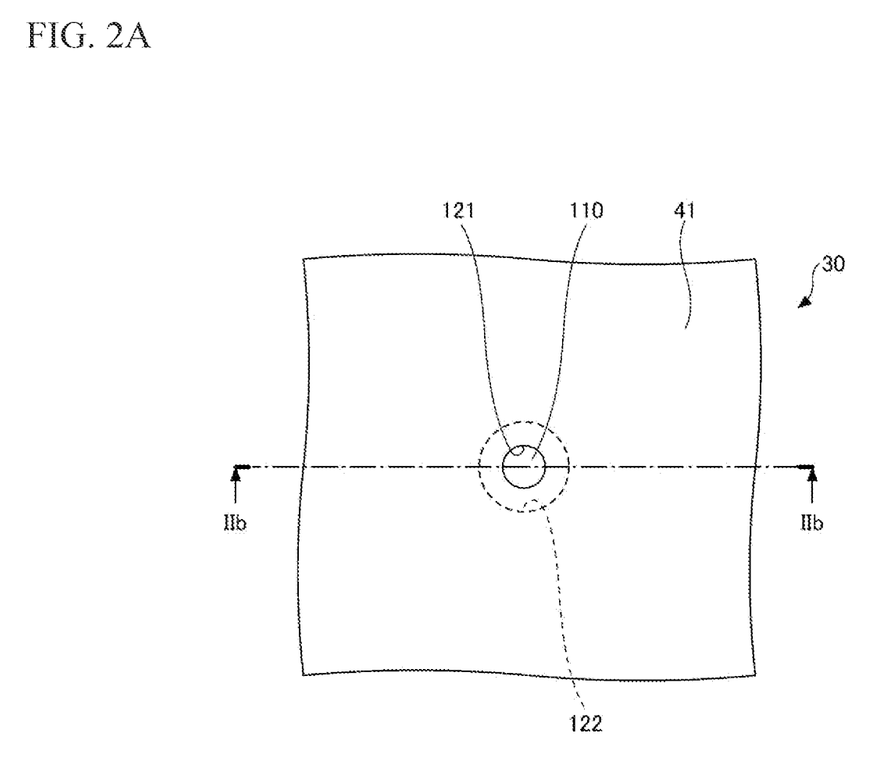
FIGS. 2A and 2B show an electrostatic adsorption member according to the first embodiment.
Figure 2B:
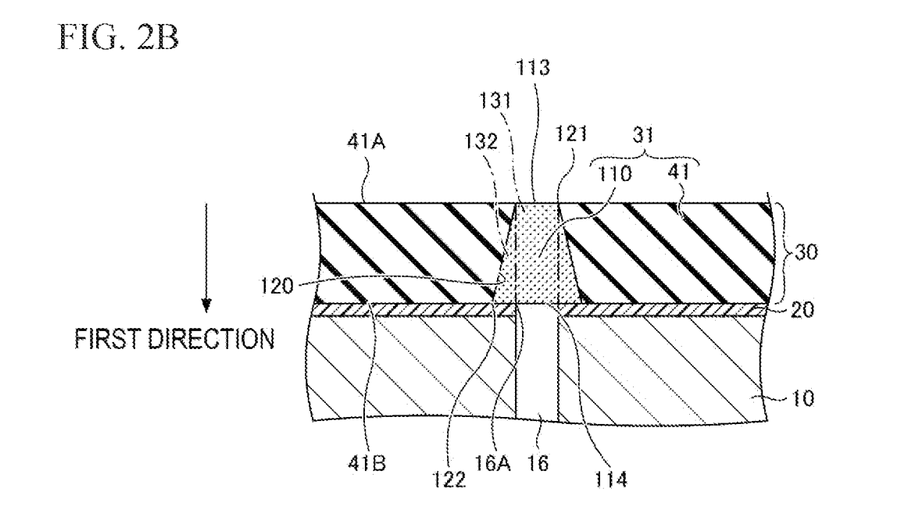

Here, shapes of the porous body 110 and the through-hole 120 are described. FIGS. 2A and 2B show the electrostatic adsorption member 30 according to the first embodiment. FIG. 2A is a plan view, and FIG. 2B is a cross-sectional view. FIG. 2B corresponds to a cross-sectional view taken along a line IIb-IIb in FIG. 2A.

As shown in FIGS. 2A and 2B, the porous body 110 has a truncated cone shape, and the through-hole 120 has a shape in which the porous body 110 is fitted.

The through-hole 120 has an upper opening 121 located in the first surface 41A and a lower opening 122 located in the second surface 41B. The upper opening 121 and the lower opening 122 have circular shapes, and a center of the upper opening 121 and a center of the lower opening 122 overlap each other, as seen in a plan view from a first direction perpendicular to the first surface 41A.

In addition, a diameter of the lower opening 122 is larger than a diameter of the upper opening 121. An opening area of the through-hole 120 in a plane parallel to the first surface 41A increases linearly from the upper opening 121 to the lower opening 122. That is, an inner wall surface of the through-hole 120 is formed as an inclined surface inclined from the first direction so that the opening area of the through-hole 120 increases toward the lower opening 122. The difference between the minimum diameter and the maximum diameter of the opening area of the through-hole 120 is equal to or more than 0.4 mm. In this example, the difference between the diameter of the upper opening 121 and the diameter of the lower opening 122 is equal to or more than 0.4 mm. In a plan view from the first direction, the entire upper opening 121 is inside the lower opening 122. The upper opening 121 is an example of the first opening, and the lower opening 122 is an example of the second opening. In this case, the first distance is 0 and the second distance is the same as the thickness of the dielectric member 41.

As described above, the porous body 110 has a truncated cone shape. The porous body 110 has a third surface 113 flush with the first surface 41A, and a fourth surface 114 flush with the second surface 41B. A shape and a size of the third surface 113 substantially match the shape and size of the upper opening 121. A shape and a size of the fourth surface 114 substantially match the shape and size of the lower opening 122. The porous body 110 has a first portion 131 located inside the upper opening 121 and a second portion 132 connected to the first portion 131 and located outside the upper opening 121, in a plan view from the first direction. A cross-sectional area of a cross section of the porous body 110 perpendicular to the first direction is larger than the opening area of the upper opening 121, except an area of the third surface 113.

As described above, the through-hole 120 is configured to communicate with the gas channel 16. The lower opening 122 of the through-hole 120 and the fourth surface 114 of the porous body 110 are formed larger than an opening 16A of the gas channel 16 on the electrostatic adsorption member 30-side, in a plan view.

In the substrate fixing device 1 according to the first embodiment, the porous body 110 has the first portion 131 and the second portion 132. Therefore, even when the adhesion between the porous body 110 and the dielectric member 41 is reduced, detachment of the porous body 110 from the through-hole 120 can be suppressed. That is, even when the cooling gas is supplied to the through-hole 120 from the gas channel 16 provided in the base plate 10, and therefore, a gas pressure is applied to the porous body 110, the second portion 132 cannot pass through the upper opening 121 and is constrained in the through-hole 120, so that detachment of the porous body 110 from the through-hole 120 can be suppressed.

Therefore, it is possible to suppress detachment of the porous body 110 from the through-hole 120 and to suppress abnormal electrical discharge due to detachment of the porous body 110.

Further, since the porous body 110 is bonded to the dielectric member 41, excellent bonding strength is obtained between the porous body 110 and the dielectric member 41. In particular, when the dielectric member 41 is made of ceramic, it is easy to obtain favorable bonding strength.

The porous body 110 is preferably in contact with the dielectric member 41 made of ceramic. This is because favorable bonding strength is obtained, a difference in coefficient of thermal expansion between the porous body and the dielectric member is small, and the thermal stress can be reduced.

Further, since the third surface 113 of the porous body 110 is flush with the first surface 41A, no substantial gap occurs between the third surface 113 and the substrate when the substrate is adsorbed by the electrostatic adsorption member 30. For this reason, it is possible to suppress the electrical discharge between the porous body 110 and the substrate.

A method of providing the porous body 110 in the through-hole 120 is not limited. For example, the porous body 110 may be formed by sintering of an inorganic material or the like, and may be fixed to an inner surface of the through-hole 120 by an adhesive or the like. Further, the porous body 110 may be formed in the through-hole 120 by applying a paste including particles, preferably, spherical particles of an inorganic material, into the through-hole 120 and then firing the paste. As the inorganic material, ceramic, glass or the like can be used. In particular, it is preferable that a main component of the porous body 110 and a main component of the dielectric member 41 are the same.

In the former method, strictly speaking, the porous body 110 is formed slightly smaller than the through-hole 120 and a gap is filled with an adhesive or the like. However, in the latter method, the porous body 110 can be directly bonded to the inner wall surface of the through-hole 120. For this reason, according to the latter method, an occupying ratio of the porous body 110 in the through-hole 120 can be increased. Further, in the case of the latter method, by applying the paste from the lower opening 122, it is easy to embed the paste in the through-hole 120 without forming a void.

Note that, in a plan view from the first direction, when at least a portion of the upper opening 121 is inside the lower opening 122, at least a portion of the upper opening 121 may also be outside the lower opening 122.

Second Embodiment

Figure 3:
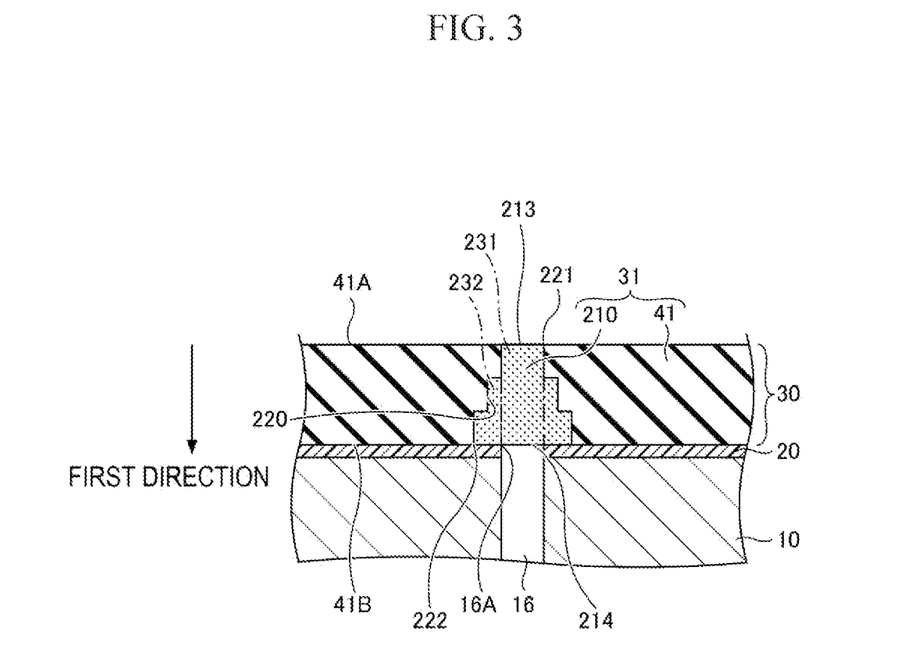
FIG. 3 is a cross-sectional view showing an electrostatic adsorption member according to a second embodiment.

Next, a second embodiment is described. The second embodiment is different from the first embodiment, in terms of the shapes of the through-hole and the porous body. Here, the shapes of the porous body and the through-hole in the second embodiment are described. FIG. 3 is a cross-sectional view showing the electrostatic adsorption member 30 according to the second embodiment.

In the second embodiment, the base body 31 has a plurality of porous bodies 210, instead of the plurality of porous bodies 110. Further, the dielectric member 41 is formed with a plurality of through-holes 220, instead of the plurality of through-holes 120. The through-holes 220 are configured to communicate with the gas channel 16 of the base plate 10. One porous body 210 is provided in each through-hole 220.

As shown in FIG. 3, the porous body 210 has such a shape that a plurality of, for example, three cylinders, which have smaller cross-sectional areas as the cylinders are located closer to the first surface 41A, are overlapped, and the through-hole 220 has a shape in which the body 210 is fitted.

The through-hole 220 has an upper opening 221 located in the first surface 41A and a lower opening 222 located in the second surface 41B. The upper opening 221 and the lower opening 222 have circular shapes, and a center of the upper opening 221 and a center of the lower opening 222 overlap each other, as seen in a plan view from the first direction perpendicular to the first surface 41A.

In addition, a diameter of the lower opening 222 is larger than a diameter of the upper opening 221. An opening area of the through-hole 220 in a plane parallel to the first surface 41A increases stepwise from the upper opening 221 to the lower opening 222. That is, an inner wall surface of the through-hole 220 is a stepped surface. The difference between the minimum diameter and the maximum diameter of the opening area of the through-hole 220 is equal to or more than 0.4 mm. In this example, the difference between the diameter of the upper opening 221 and the diameter of the lower opening 222 is equal to or more than 0.4 mm. In a plan view from the first direction, the entire upper opening 221 is inside the lower opening 222. The upper opening 221 is an example of the first opening, and the lower opening 222 is an example of the second opening. In this case, the first distance is 0 and the second distance is the same as the thickness of the dielectric member 41.

As described above, the porous body 210 has such a shape that a plurality of, for example, three cylinders, which have smaller cross-sectional areas as the cylinders are located closer to the first surface 41A, are overlapped. The porous body 210 has a third surface 213 flush with the first surface 41A, and a fourth surface 214 flush with the second surface 41B. A shape and a size of the third surface 213 substantially match the shape and size of the upper opening 221. A shape and a size of the fourth surface 214 substantially match the shape and size of the lower opening 222. The porous body 210 has a first portion 231 located inside the upper opening 221 and a second portion 232 connected to the first portion 231 and located outside the upper opening 221, in a plan view from the first direction. A cross-sectional area of a cross section of the porous body 210 perpendicular to the first direction is larger than the opening area of the upper opening 221, except an area of the third surface 213.

As described above, the through-hole 220 is configured to communicate with the gas channel 16. The lower opening 222 of the through-hole 220 and the fourth surface 214 of the porous body 210 are formed larger than the opening 16A of the gas channel 16 on the electrostatic adsorption member 30-side, in a plan view.

In the substrate fixing device according to the second embodiment, the porous body 210 has the first portion 231 and the second portion 232. Therefore, even when the adhesion between the porous body 210 and the dielectric member 41 is reduced, detachment of the porous body 210 from the through-hole 220 can be suppressed. That is, even when the cooling gas is supplied to the through-hole 220 from the gas channel 16 provided in the base plate 10, and therefore, a gas pressure is applied to the porous body 210, the second portion 232 cannot pass through the upper opening 221 and is constrained in the through-hole 220, so that detachment of the porous body 210 from the through-hole 220 can be suppressed.

A method of providing the porous body 210 in the through-hole 220 is not limited. For example, the porous body 210 may be formed by sintering of an inorganic material or the like, and may be fixed to an inner surface of the through-hole 220 by an adhesive or the like. Further, the porous body 210 may be formed in the through-hole 220 by applying a paste including particles, preferably, spherical particles of an inorganic material, into the through-hole 220 and then firing the paste. In the case of the latter method, by applying the paste from the lower opening 222, it is easy to embed the paste in the through-hole 220 without forming a void.

Third Embodiment

Figure 4:
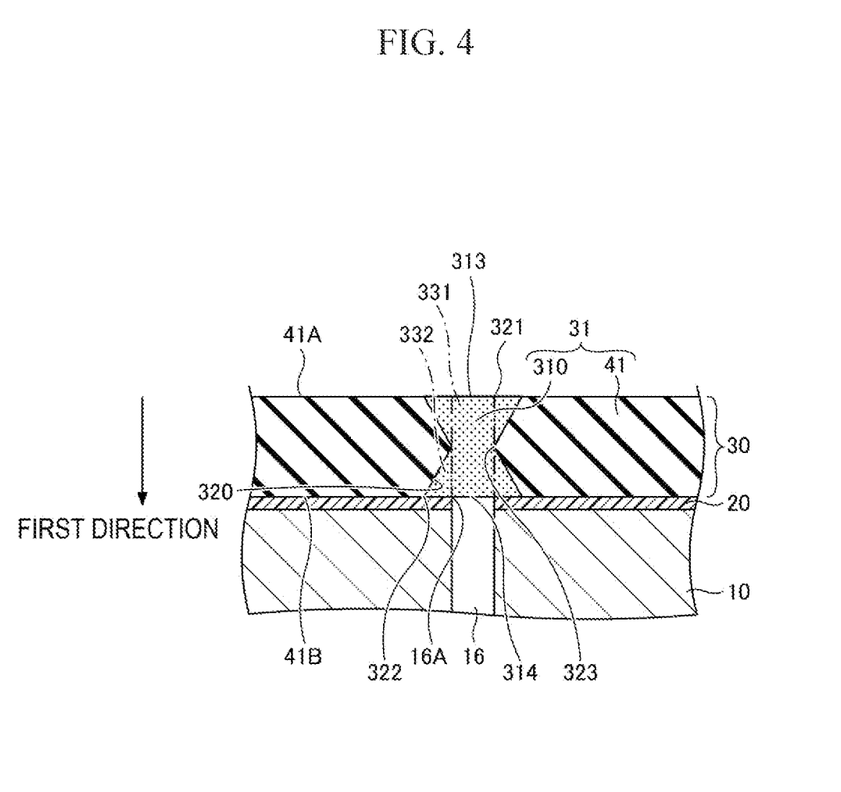
FIG. 4 is a cross-sectional view showing an electrostatic adsorption member according to a third embodiment.

Next, a third embodiment is described. The third embodiment is different from the first embodiment, in terms of the shapes of the through-hole and the porous body. Here, the shapes of the porous body and the through-hole in the third embodiment are described. FIG. 4 is a cross-sectional view showing the electrostatic adsorption member 30 according to the third embodiment.

In the third embodiment, the base body 31 has a plurality of porous bodies 310, instead of the plurality of porous bodies 110. Further, the dielectric member 41 is formed with a plurality of through-holes 320, instead of the plurality of through-holes 120. The through-holes 320 are configured to communicate with the gas channel 16 of the base plate 10. One porous body 310 is provided in each through-hole 320.

As shown in FIG. 4, the porous body 310 has a drum shape, and the through-hole 320 has a shape in which the porous body 310 is fitted.

The through-hole 320 has an upper opening 321 located in the first surface 41A, a lower opening 322 located in the second surface 41B, and an intermediate opening 323 located between the upper opening 321 and the lower opening 322. The upper opening 321, the lower opening 322 and the intermediate opening 323 have circular shapes, and a center of the upper opening 321, a center of the lower opening 322 and a center of the intermediate opening 323 overlap each other, as seen in a plan view from the first direction perpendicular to the first surface 41A.

In addition, a diameter of the lower opening 322 and a diameter of the upper opening 321 are substantially the same. The diameter of the upper opening 321 and the diameter of the lower opening 322 are larger than a diameter of the intermediate opening 323. An opening area of the through-hole 320 in a plane parallel to the first surface 41A decreases linearly from the upper opening 321 to the intermediate opening 323, and increases linearly from the intermediate opening 323 to the lower opening 322. That is, an inner wall surface of the through-hole 320 is formed as an inclined surface inclined from the first direction so that the opening area of the through-hole 320 decreases toward the intermediate opening 323 between the upper opening 321 and the intermediate opening 323 and the opening area of the through-hole 320 increases toward the lower opening 322 between the intermediate opening 323 and the lower opening 322. The difference between the minimum diameter and the maximum diameter of the opening area of the through-hole 320 is equal to or more than 0.4 mm. In this example, the difference between the diameter of the intermediate opening 323 and the diameter of the upper opening 321 or the lower opening 322 is equal to or more than 0.4 mm. In a plan view from the first direction, the entire intermediate opening 323 is inside the lower opening 322. The intermediate opening 323 is an example of the first opening, and the lower opening 322 is an example of the second opening. In this case, the first distance is a distance between the first surface 41A and the intermediate opening 323, and the second distance is the same as the thickness of the dielectric member 41.

As described above, the porous body 310 has a drum shape. The porous body 310 has a third surface 313 flush with the first surface 41A, and a fourth surface 314 flush with the second surface 41B. A shape and a size of the third surface 313 substantially match the shape and size of the upper opening 321. A shape and a size of the fourth surface 314 substantially match the shape and size of the lower opening 322. The porous body 310 has a first portion 331 located inside the intermediate opening 323 and a second portion 332 connected to the first portion 331 and located closer to the lower opening 322 than the intermediate opening 323 and outside the intermediate opening 323, in a plan view from the first direction. As for a cross-sectional area of a cross section of the porous body 310 perpendicular to the first direction, a side closer to the lower opening 322 than the intermediate opening 323 has a cross-sectional area larger than an opening area of the intermediate opening 323.

As described above, the through-hole 320 is configured to communicate with the gas channel 16. The lower opening 322 of the through-hole 320 and the fourth surface 314 of the porous body 310 are formed larger than the opening 16A of the gas channel 16 on the electrostatic adsorption member 30-side, in a plan view. The lower opening 322 of the through-hole 320 and the fourth surface 314 of the porous body 310 may also be formed smaller than the opening 16A of the gas channel 16 on the electrostatic adsorption member 30-side, in a plan view.

In the substrate fixing device according to the third embodiment, the porous body 310 has the first portion 331 and the second portion 332. Therefore, even when the adhesion between the porous body 310 and the dielectric member 41 is reduced, detachment of the porous body 310 from the through-hole 320 can be suppressed. That is, even when the cooling gas is supplied to the through-hole 320 from the gas channel 16 provided in the base plate 10, and therefore, a gas pressure is applied to the porous body 310, the second portion 332 cannot pass through the intermediate opening 323 and is constrained in the through-hole 320, so that detachment of the porous body 310 from the through-hole 320 can be suppressed.

A method of providing the porous body 310 in the through-hole 320 is not limited. For example, the porous body 310 may be formed in the through-hole 320 by applying a paste including particles, preferably, spherical particles of an inorganic material, into the through-hole 320 and then firing the paste.

Fourth Embodiment

Figure 5:
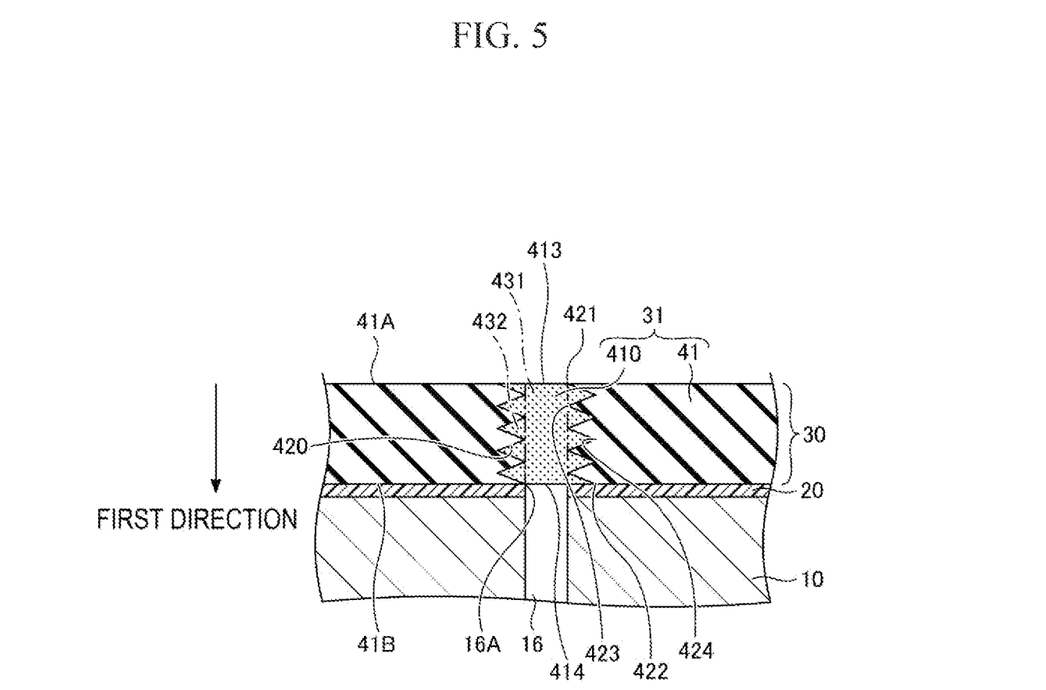
FIG. 5 is a cross-sectional view showing an electrostatic adsorption member according to a fourth embodiment.

Next, a fourth embodiment is described. The fourth embodiment is different from the first embodiment, in terms of the shapes of the through-hole and the porous body. Here, the shapes of the porous body and the through-hole in the fourth embodiment are described. FIG. 5 is a cross-sectional view showing the electrostatic adsorption member 30 according to the fourth embodiment.

In the fourth embodiment, the base body 31 has a plurality of porous bodies 410, instead of the plurality of porous bodies 110. Further, the dielectric member 41 is formed with a plurality of through-holes 420, instead of the plurality of through-holes 120. The through-holes 420 are configured to communicate with the gas channel 16 of the base plate 10. One porous body 410 is provided in each through-hole 420.

As shown in FIG. 5, the porous body 410 has a side surface on which spiral grooves are formed like a male screw, the through-hole 420 has an inner wall surface on which spiral grooves are formed like a female screw, and the through-hole 420 has a shape in which the porous body 410 is fitted.

The through-hole 420 has an upper opening 421 located in the first surface 41A and a lower opening 422 located in the second surface 41B. The upper opening 421 and the lower opening 422 have circular shapes, and a center of the upper opening 421 and a center of the lower opening 422 substantially overlap each other, as seen in a plan view from the first direction perpendicular to the first surface 41A.

In a plan view from the first direction perpendicular to the first surface 41A, a bottom portion curve connecting bottom portions of the spiral grooves formed on the side surface of the through-hole 420 is annular, and a top portion curve connecting top portions between the grooves adjacent to each other in the first direction is also annular. An area of a ring of the bottom portion curve is larger than an area of a ring of the top portion curve. In a plan view from the first direction perpendicular to the first surface 41A, a top portion opening 423 corresponding to the top portion curve constituting a ring of one round is an example of the first opening, and a bottom portion opening 424, which is located closer to the lower opening 422 than the top portion opening 423 and corresponds to the bottom portion curve constituting a ring of one round, is an example of the second opening. In this case, the first distance is a distance between the first surface 41A and a portion of the top portion opening 423 closest to the first surface 41A, and the second distance is a distance between the first surface 41A and a portion of the bottom portion opening 424 closest to the first surface 41A. In a plan view from the first direction, the entire top portion opening 423 is inside the bottom portion opening 424.

As described above, the porous body 410 has the side surface on which the spiral grooves are formed like a male screw. The porous body 410 has a third surface 413 flush with the first surface 41A, and a fourth surface 414 flush with the second surface 41B. A shape and a size of the third surface 413 substantially match the shape and size of the upper opening 421. A shape and a size of the fourth surface 414 substantially match the shape and size of the lower opening 422. The porous body 410 has a first portion 431 located inside the top portion opening 423 and a second portion 432 connected to the first portion 431 and located closer to the lower opening 422 than the top portion opening 423 and outside the top portion opening 423, in a plan view from the first direction.

As described above, the through-hole 420 is configured to communicate with the gas channel 16. The lower opening 422 of the through-hole 420 and the fourth surface 414 of the porous body 410 are formed larger than the opening 16A of the gas channel 16 on the electrostatic adsorption member 30-side, in a plan view. The lower opening 422 of the through-hole 420 and the fourth surface 414 of the porous body 410 may also be formed smaller than the opening 16A of the gas channel 16 on the electrostatic adsorption member 30-side, in a plan view.

In the substrate fixing device according to the fourth embodiment, the porous body 410 has the first portion 431 and the second portion 432. Therefore, even when the adhesion between the porous body 410 and the dielectric member 41 is reduced, detachment of the porous body 410 from the through-hole 420 can be suppressed. That is, even when the cooling gas is supplied to the through-hole 420 from the gas channel 16 provided in the base plate 10, and therefore, a gas pressure is applied to the porous body 410, the second portion 432 cannot pass through the top portion opening 423 and is constrained in the through-hole 420, so that detachment of the porous body 410 from the through-hole 420 can be suppressed.

A method of providing the porous body 410 in the through-hole 420 is not limited. For example, the porous body 410 may be formed by sintering of an inorganic material or the like, and may be fixed to an inner surface of the through-hole 420 by an adhesive or the like. The porous body 410 can be screwed into the through-hole 420. Further, the porous body 410 may be formed in the through-hole 420 by applying a paste including particles, preferably, spherical particles of an inorganic material, into the through-hole 420 and then firing the paste.

Although the preferred embodiments and the like have been described in detail, the present invention is not limited to the above-described embodiments and the like, and a variety of changes and replacements can be made for the above-described embodiments and the like without departing from the scope defined in the claims.

What is claimed is:

1. An electrostatic adsorption member comprising:
   a dielectric member having a first surface and a second surface on an opposite side to the first surface and formed with a through-hole penetrating from the first surface to the second surface; and
   a porous body provided in the through-hole and having a third surface flush with the first surface,
   wherein the through-hole has:
      a first opening apart from the first surface by a first distance in a first direction perpendicular to the first surface, and
      a second opening apart from the first surface by a second distance larger than the first distance in the first direction,
   wherein in a plan view from the first direction, at least a portion of the first opening is inside the second opening,
   wherein in a plan view from the first direction, the porous body has:
      a first portion located inside the first opening, and
      a second portion connected to the first portion and located outside the first opening, and
   wherein an entirety of the through-hole is filled with the porous body.

2. The electrostatic adsorption member according to claim 1, wherein the first opening is located in the first surface.

3. The electrostatic adsorption member according to claim 1, wherein the second opening is located in the second surface.

4. The electrostatic adsorption member according to claim 1, wherein in a plan view from the first direction, the entire first opening is inside the second opening.

5. An electrostatic adsorption member comprising:

a dielectric member having a first surface and a second surface on an opposite side to the first surface and formed with a through-hole penetrating from the first surface to the second surface; and a porous body provided in the through-hole and having a third surface flush with the first surface, wherein the through-hole has:
- a first opening apart from the first surface by a first distance in a first direction perpendicular to the first surface, and
- a second opening apart from the first surface by a second distance larger than the first distance in the first direction, wherein in a plan view from the first direction, at least a portion of the first opening is inside the second opening, wherein in a plan view from the first direction, the porous body has:
- a first portion located inside the first opening, and
- a second portion connected to the first portion and located outside the first opening, and wherein an inner wall surface of the through-hole is formed with a spiral groove.

6. The electrostatic adsorption member according to claim 1, wherein the dielectric member has an electrostatic electrode embedded therein.

7. A substrate fixing device comprising:
the electrostatic adsorption member according to claim 1; and
a base plate bonded to the second surface.

8. The electrostatic adsorption member according to claim 5, wherein the first opening is located in the first surface.

9. The electrostatic adsorption member according to claim 5, wherein the second opening is located in the second surface.

10. The electrostatic adsorption member according to claim 5, wherein the dielectric member has an electrostatic electrode embedded therein.

11. A substrate fixing device comprising:
the electrostatic adsorption member according to claim 5; and
a base plate bonded to the second surface.

* * * * *